(12) United States Patent　　　　(10) Patent No.:　US 12,610,454 B2

Liao　　　　　　　　　　　　　　　　(45) Date of Patent:　　Apr. 21, 2026

(54) CIRCUIT BOARD AND MANUFACTURING METHOD THEREOF

(71) Applicant: Boardtek Electronics Corporation, Taoyuan City (TW)

(72) Inventor: Chung-Hsing Liao, Taoyuan City (TW)

(73) Assignee: BOARDTEK ELECTRONICS CORPORATION, Taoyuan City (TW)

( * ) Notice: Subject to any disclaimer, the term of this patent is extended or adjusted under 35 U.S.C. 154(b) by 219 days.

(21) Appl. No.: 18/642,147

(22) Filed: Apr. 22, 2024

(65) Prior Publication Data

US 2025/0331100 A1　　Oct. 23, 2025

(51) Int. Cl.
*H05K 1/02*　　　　　(2006.01)
*H05K 3/12*　　　　　(2006.01)

(52) U.S. Cl.
CPC ......... *H05K 1/0243* (2013.01); *H05K 3/1216* (2013.01); *H05K 2201/09545* (2013.01); *H05K 2201/10416* (2013.01); *H05K 2201/1053* (2013.01); *H05K 2201/10598* (2013.01); *H05K 2203/0278* (2013.01)

(58) Field of Classification Search
CPC .................. H05K 1/0243; H05K 2201/10416
See application file for complete search history.

(56) References Cited

U.S. PATENT DOCUMENTS

| | | | |
|---|---|---|---|
| 10,939,538 B1 * | 3/2021 | Wu ...................... | H05K 1/0204 |
| 2016/0037620 A1 * | 2/2016 | Kang .................. | H01L 23/3677 |
| | | | 361/711 |
| 2019/0036247 A1 * | 1/2019 | Hirasawa ............. | H01R 43/205 |

FOREIGN PATENT DOCUMENTS

| | | |
|---|---|---|
| CN | 105323951 A | 2/2016 |
| CN | 109936916 A | 6/2019 |
| CN | 211909287 U | 11/2020 |
| TW | 202142057 A | 11/2021 |
| TW | 202147939 A | 12/2021 |
| TW | 202233038 A | 8/2022 |

\* cited by examiner

*Primary Examiner* — Sherman Ng
(74) *Attorney, Agent, or Firm* — Muncy, Geissler, Olds & Lowe, P.C.

(57)　　　　　　　ABSTRACT

A circuit board includes a first external wiring layer, a second external wiring layer, a first internal structure, and a second internal structure. The first internal structure and the second internal structure are disposed between the first external wiring layer and the second external wiring layer. The first internal structure includes a first metal block extending from the first external wiring layer to the second internal structure. The second internal structure includes a second metal block, a high-frequency substrate, and a first conductive material. The second metal block penetrates through the high-frequency substrate. The first conductive material is disposed on the first metal block, in which the second metal block extends from the second external wiring layer to the first conductive material, and the first conductive material electrically connects the first metal block and the second metal block.

15 Claims, 7 Drawing Sheets

CIRCUIT BOARD AND MANUFACTURING METHOD THEREOF

BACKGROUND

Field of Invention

The present disclosure relates to a circuit board and a manufacturing method thereof, and in particular to a circuit board with a high-frequency substrate and a manufacturing method thereof.

Description of Related Art

Circuit boards of communication products have embedded high-frequency substrates therein, and metal blocks (for example, metal copper blocks) may be provided in the high-frequency substrates to solve the heat dissipation problem of electronic components. However, with the development of semiconductor technology, the transmit/receive designs of the communication products have become more and more complex. For example, 5G or 6G communication products have more transmit/receive designs (for example, antennas), so they will generate more heat energy. However, existing circuit boards are difficult to solve the heat dissipation problems caused by the complex transmit/receive designs. In view of the above, there is an urgent need to develop a circuit board and a manufacturing method thereof to overcome the above problems.

SUMMARY

A circuit board provided by the present disclosure includes a plurality of metal blocks stacked on each other, so that backsides of electronic components can achieve the heat dissipation effect through these metal blocks. Since the electronic components (for example, chips) and these metal blocks are stacked and aligned vertically, good heat dissipation paths are formed, thereby improving the heat dissipation effect on the electronic components.

A circuit board provided by at least one embodiment of the present disclosure includes a first external wiring layer, a second external wiring layer, a first internal structure, and a second internal structure. The first internal structure and the second internal structure are disposed between the first external wiring layer and the second external wiring layer. The first internal structure is disposed between the first external wiring layer and the second internal structure. The second internal structure is disposed between the first internal structure and the second external wiring layer. The first internal structure includes a first metal block, in which the first metal block extends from the first external wiring layer to the second internal structure. The second internal structure includes a second metal block, a high-frequency substrate, and a first conductive material. The second metal block penetrates through the high-frequency substrate, in which the high-frequency substrate includes a top wiring layer, a bottom wiring layer, and a substrate body disposed between the top wiring layer and the bottom wiring layer. The first conductive material is disposed on the first metal block, in which the second metal block extends from the second external wiring layer to the first conductive material, and the first conductive material electrically connects the first metal block and the second metal block.

In at least one embodiment of the present disclosure, a bottom of the second metal block protrudes from a bottom surface of the bottom wiring layer of the high-frequency substrate.

In at least one embodiment of the present disclosure, a thickness of the high-frequency substrate is less than a thickness of the second metal block.

In at least one embodiment of the present disclosure, the second internal structure further includes a filling material, the filling material is disposed between the second metal block and the substrate body, and the filling material contacts the first conductive material.

In at least one embodiment of the present disclosure, the circuit board further includes an electronic component and a plated through-hole. The electronic component is located directly above the second metal block and is electrically connected to the second external wiring layer. The plated through-hole penetrates through the high-frequency substrate.

In at least one embodiment of the present disclosure, a width of the first metal block is wider than a width of the second metal block.

In at least one embodiment of the present disclosure, a top surface of the second metal block is flush with a top surface of the top wiring layer.

In at least one embodiment of the present disclosure, the second internal structure further includes a third metal block and a second conductive material. The second conductive material is disposed on the first metal block, in which the third metal block extends from the second external wiring layer to the second conductive material, and the second conductive material electrically connects the first metal block and the third metal block.

In at least one embodiment of the present disclosure, a top surface of the third metal block is flush with a top surface of the top wiring layer.

In at least one embodiment of the present disclosure, a bottom of the third metal block protrudes from a bottom surface of the bottom wiring layer of the high-frequency substrate.

A manufacturing method of a circuit board provided by at least one embodiment of the present disclosure includes the following steps: providing a first wiring substrate, wherein the first wiring substrate includes a first external metal layer and a first groove; providing a first metal block, wherein a width of the first metal block is less than a width of the first groove; disposing the first metal block in the first groove; providing a second wiring substrate, wherein the second wiring substrate includes a second external metal layer and a second groove; providing a high-frequency substrate, wherein a width of the high-frequency substrate is less than a width of the second groove; disposing the high-frequency substrate in the second groove; fixing the first wiring substrate, the high-frequency substrate and the second wiring substrate together through a rivet; removing a portion of the high-frequency substrate and a portion of the second wiring substrate to form a third groove, wherein the third groove exposes a portion of a top surface of the first metal block; disposing a first conductive material at a bottom of the third groove; providing a second metal block, wherein a width of the second metal block is less than a width of the third groove, and the width of the second metal block is less than the width of the first metal block; disposing the second metal block in the third groove; disposing a first filling material around the second metal block; after disposing the second metal block in the third groove, forming a plurality of plated through-holes in the first wiring substrate and the second wiring substrate; forming a first external wiring layer by using the first external metal layer; and forming a second external wiring layer by using the second external metal layer.

In at least one embodiment of the present disclosure, the manufacturing method of a circuit board further includes: removing the rivet after disposing the second metal block in the third groove.

In at least one embodiment of the present disclosure, the manufacturing method of a circuit board further includes: removing another portion of the high-frequency substrate and another portion of the second wiring substrate to form a fourth groove, wherein the fourth groove exposes another portion of a top surface of the first metal block; disposing a second conductive material at a bottom of the fourth groove; providing a third metal block, a width of the third metal block is less than a width of the fourth groove, wherein the width of the third metal block is less than the width of the first metal block; disposing the third metal block in the fourth groove; and disposing a second filling material around the third metal block.

In at least one embodiment of the present disclosure, after fixing the first wiring substrate, the high-frequency substrate and the second wiring substrate together through the rivet, performing a pressing step to press the first wiring substrate, the high-frequency substrate, the second wiring substrate and the first metal block through release films.

In at least one embodiment of the present disclosure, the first filling material is disposed around the second metal block by screen printing, and then the first filling material is pre-baked at 105° C. to 115° C. for 58 minutes to 62 minutes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
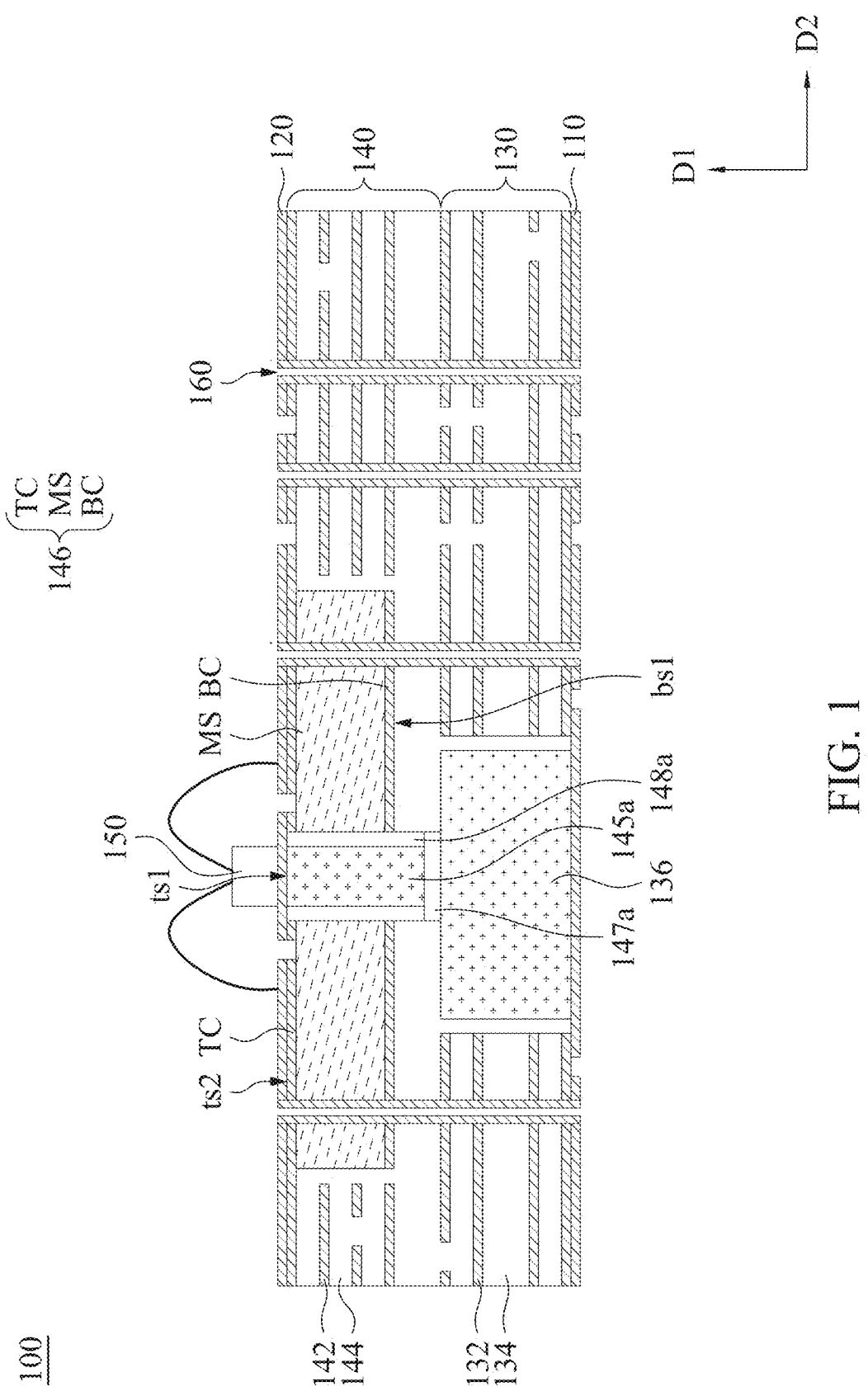
FIG. 1 is a schematic cross-sectional view of a circuit board according to one embodiment of the present disclosure.

In the following text, in order to clearly present technical features of the present application, the dimensions (for example, length, width, thickness and depth) of components (for example, wiring layers, insulating layers and metal blocks, etc.) in the drawings may be scaled in unequal proportions, and the number of some components may be reduced. Therefore, the description and explanation of the following embodiments are not limited to the number of components in the drawings and the size and shape of the components, but should cover the deviations in sizes, shapes and both caused by actual manufacturing processes and/or tolerances. For example, flat surfaces shown in the drawings may have rough and/or non-linear features, while acute angles shown in the drawings may be rounded. Therefore, the components shown in the drawings of the present application are mainly for illustration and are not intended to accurately depict the actual shapes of the components, nor are used to limit the scope of the patent application of the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. That is, when the device is oriented differently from the drawings (rotated 90 degrees or at other orientations), the spatially relative terms used in the present disclosure may also be interpreted accordingly.

It will be understood that, although the terms "first", "second", etc. may be used herein to describe various components, these components should not be limited by these terms. These terms are only used to distinguish one component from another. For example, a first component could be referred to as a second component, and similarly, a second component could be referred to as a first component, without departing from the scope of the embodiments. As used herein, the term "and/or" includes any and all combinations of one or more of related listed items.

In the present specification, a range represented by "one value to another value" is a summary representation that avoids enumerating all the values in the range in the specification. Therefore, the recitation of a particular numerical range covers any numerical value within the numerical range and the smaller numerical range defined by any numerical values within the numerical range, as if the arbitrary value and the smaller numerical range are expressly stated in the specification.

FIG. 1 is a schematic cross-sectional view of a circuit board 100 according to one embodiment of the present disclosure. The circuit board 100 includes a first external wiring layer 110, a second external wiring layer 120, a first internal structure 130 and a second internal structure 140. The first internal structure 130 and the second internal structure 140 are disposed between the first external wiring layer 110 and the second external wiring layer 120. Specifically, the first internal structure 130 is disposed between the first external wiring layer 110 and the second internal structure 140, and the second internal structure 140 is disposed between the first internal structure 130 and the second external wiring layer 120. In other words, the first external wiring layer 110, the first internal structure 130, the second internal structure 140 and the second external wiring layer 120 are stacked along a first direction D1. The first external wiring layer 110, the second external wiring layer 120, the first internal structure 130 and the second internal structure 140 extend along parallel directions of a second direction D2. The first external wiring layer 110 and the second external wiring layer 120 may be, for example, patterned copper metal layers.

The first internal structure 130 includes a plurality of internal wiring layers 132 and a plurality of insulating layers 134, and the plurality of internal wiring layers 132 and the plurality of insulating layers 134 are stacked in a staggered manner. Each insulating layer 134 is disposed between every two internal wiring layers 132 to separate different layers of internal wiring layers and avoid short circuits. Each of the plurality of internal wiring layers 132 may be, for example, a copper metal layer. The material of each of the plurality of insulating layers 134 may be, for example, a composite material containing fiberglass and epoxy resin, such as FR4.

The first internal structure 130 also includes a first metal block 136, in which the first metal block 136 extends from the first external wiring layer 110 to the second internal structure 140. Specifically, the first metal block 136 is embedded in the first internal structure 130. More specifically, the first metal block 136 is embedded in the plurality of internal wiring layers 132 and the plurality of insulating layers 134. The material of the first metal block 136 may be, for example, copper, but is not limited thereto.

The second internal structure 140 includes a plurality of internal wiring layers 142 and a plurality of insulating layers 144, and the plurality of internal wiring layers 142 and the plurality of insulating layers 144 are stacked in a staggered manner. Each insulating layer 144 is disposed between every two internal wiring layers 142 to separate different layers of internal wiring layers and avoid short circuits. Each of the plurality of internal wiring layers 142 may be, for example, a copper metal layer. The material of each of the plurality of insulating layers 144 may be, for example, a composite material containing fiberglass and epoxy resin, such as FR4.

The second internal structure 140 also includes a second metal block 145a, a high-frequency substrate 146, and a first conductive material 147a. The high-frequency substrate 146 includes a top wiring layer TC, a bottom wiring layer BC, and a substrate body MS disposed between the top wiring layer TC and the bottom wiring layer BC. The top wiring layer TC is disposed between the second external wiring layer 120 and the substrate body MS.

The second metal block 145a of the second internal structure 140 penetrates through the high-frequency substrate 146. In the embodiment of FIG. 1, a top surface ts1 of the second metal block 145a is flush with a top surface ts2 of the top wiring layer TC, and the second external wiring layer 120 covers the second metal block 145a. In the embodiment of FIG. 1, a thickness of the high-frequency substrate 146 is less than a thickness of the second metal block 145a, so that a bottom of the second metal block 145a protrudes from a bottom surface bs1 of the bottom wiring layer BC of the high-frequency substrate 146. The material of the second metal block 145a may be, for example, copper, but is not limited thereto.

The first conductive material 147a of the second internal structure 140 is disposed on the first metal block 136, in which the second metal block 145a extends from the second external wiring layer 120 to the first conductive material 147a. The first conductive material 147a electrically connects the first metal block 136 and the second metal block 145a. Specifically, the first conductive material 147a is disposed between the first metal block 136 and the second external wiring layer 120. The first conductive material 147a may be, for example, a copper paste, a silver glue, or a solder, but is not limited thereto.

The second internal structure 140 further includes a first filling material 148a, in which the first filling material 148a is disposed between the second metal block 145a and the substrate body MS, and the first filling material 148a contacts the first conductive material 147a. Specifically, the second internal structure 140 has a hole (not labeled), and a width of the second metal block 145a is less than an inner diameter of the above hole, so that a gap is formed between the second metal block 145a and a wall of the hole. The first filling material 148a is filled in the above gap, thereby being disposed between the second metal block 145a and the substrate body MS, in which the first filling material 148a may surround the second metal block 145a. In addition, the material of the first filling material 148a may be, for example, a resin material.

The circuit board 100 further includes a first electronic component 150 and a plated through-hole 160. The first electronic component 150 is located directly above the second metal block 145a and is electrically connected to the second external wiring layer 120. Taking FIG. 1 as an example, the first electronic component 150 may be electrically connected to the second external wiring layer 120 by wire-bonding. Since the first electronic component 150 is located directly above the second metal block 145a, the first electronic component 150 can dissipate heat through the second metal block 145a and the first metal block 136 on its backside. The plated through-hole 160 passes through the high-frequency substrate 146.

As shown in FIG. 1, a width of the first metal block 136 is wider than the width of the second metal block 145a. Since the width of the second metal block 145a (which can also be understood as a small metal block) is less than the width of the first metal block 136 (which can also be understood as a large metal block), the circuit board 100 has a fan-shaped heat dissipation path (i.e., a heat dissipation area increases from top to bottom), thereby improving the heat dissipation effect on the electronic components (for example, the first electronic component 150).

Figure 2:
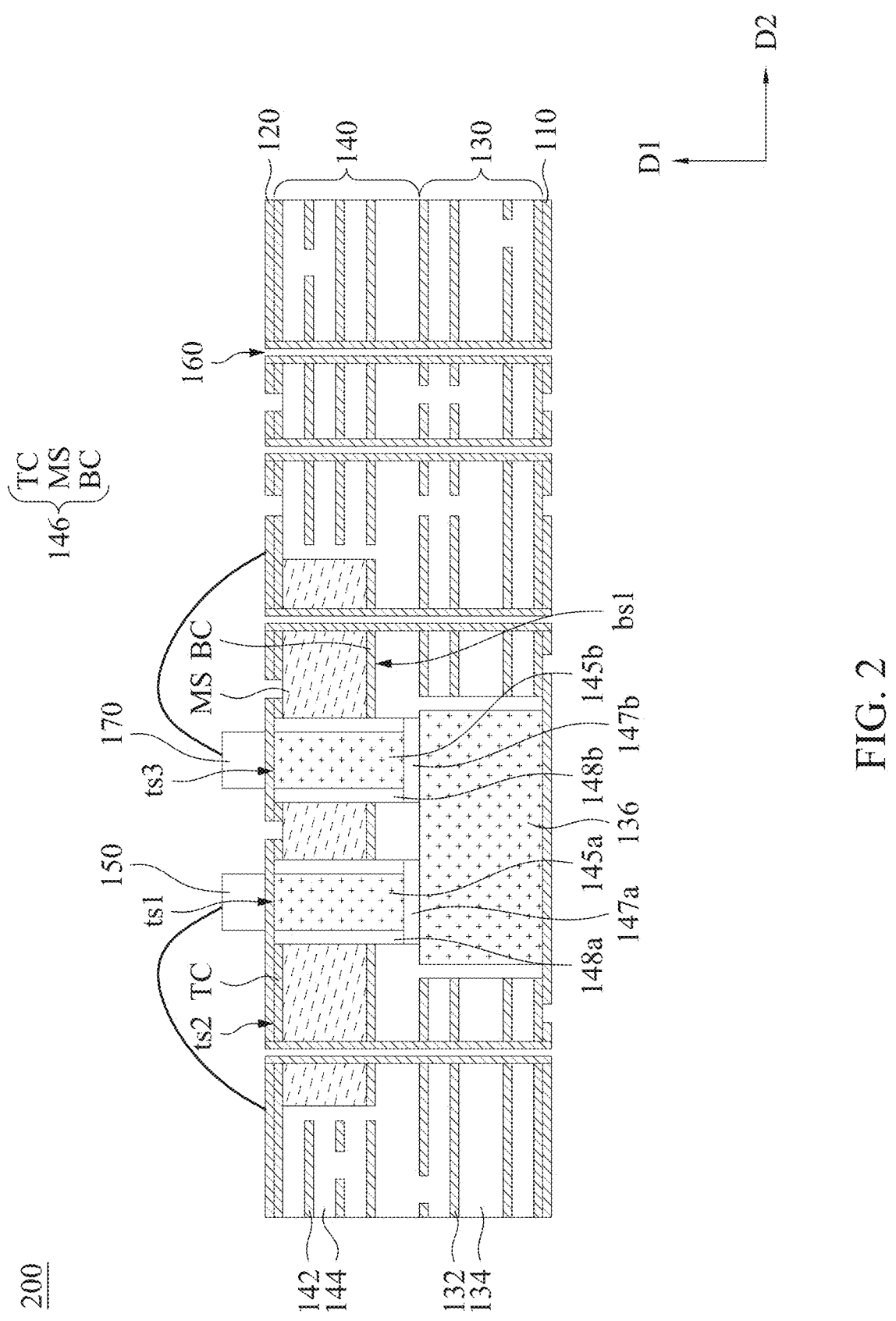
FIG. 2 is a schematic cross-sectional view of a circuit board according to another embodiment of the present disclosure.

FIG. 2 is a schematic cross-sectional view of a circuit board 200 according to another embodiment of the present disclosure. The circuit board 200 of FIG. 2 has a similar structure to that of the circuit board 100 of FIG. 1, in which the differences are the number of electronic components, small metal blocks (for example, the second metal block 145a), and conductive materials. Specifically, the second internal structure 140 of the circuit board 200 further includes a third metal block 145b, a second conductive material 147b and a second filling material 148b. The circuit board 200 further includes a second electronic component 170.

The second conductive material 147b of the second internal structure 140 is disposed on the first metal block 136, and the third metal block 145b extends from the second external wiring layer 120 to the second conductive material 147b. The second conductive material 147b electrically connects the first metal block 136 and the third metal block 145b. Specifically, the second conductive material 147b is disposed between the first metal block 136 and the second external wiring layer 120. The second conductive material 147b may be, for example, a copper paste, a silver glue, or a solder, but is not limited thereto.

The third metal block 145b of the second internal structure 140 penetrates through the high-frequency substrate 146. A top surface ts3 of the third metal block 145b is flush with the top surface ts2 of the top wiring layer TC, and the second external wiring layer 120 covers the third metal block 145b. In the embodiment of FIG. 2, the thickness of the high-frequency substrate 146 is less than a thickness of the third metal block 145b, so that a bottom of the third metal block 145b protrudes from the bottom surface bs1 of the bottom wiring layer BC of the high-frequency substrate 146. The material of the third metal block 145b may be, for example, copper, but is not limited thereto.

The second filling material 148b of the second internal structure 140 is disposed between the third metal block 145b and the substrate body MS, and the second filling material 148b contacts the second conductive material 147b. The material of the second filling material 148b may be, for example, a resin material.

The second electronic component 170 of the circuit board 200 is located directly above the third metal block 145*b* and is electrically connected to the second external wiring layer 120. Taking FIG. 2 as an example, the second electronic component 170 may be electrically connected to the second external wiring layer 120 by wire-bonding. Since the second electronic component 170 is located directly above the third metal block 145*b*, the second electronic component 170 can dissipate heat through the third metal block 145*b* and the first metal block 136 on its backside. It is worth noting that both the second metal block 145*a* and the third metal block 145*b* are connected to the first metal block 136.

As shown in FIG. 2, the width of the first metal block 136 is wider than a width of the third metal block 145*b*. Since the width of the third metal block 145*b* (which can also be understood as a small metal block) is less than the width of the first metal block 136 (which can also be understood as a large metal block), the circuit board 200 has a fan-shaped heat dissipation path (i.e., a heat dissipation area increases from top to bottom), thereby improving the heat dissipation effect on the electronic components (for example, the first electronic component 150 and the second electronic component 170).

As shown in FIG. 2, the second metal block 145*a* and the third metal block 145*b* are arranged and disposed along the second direction D2, in which the second direction D2 is substantially perpendicular to the first direction D1. The first conductive material 147*a* and the second conductive material 147*b* are also arranged and disposed along the second direction D2. The shapes of the first metal block 136, the second metal block 145*a* and the third metal block 145*b* described above may be cylindrical, but are not limited thereto.

Figure 3A:
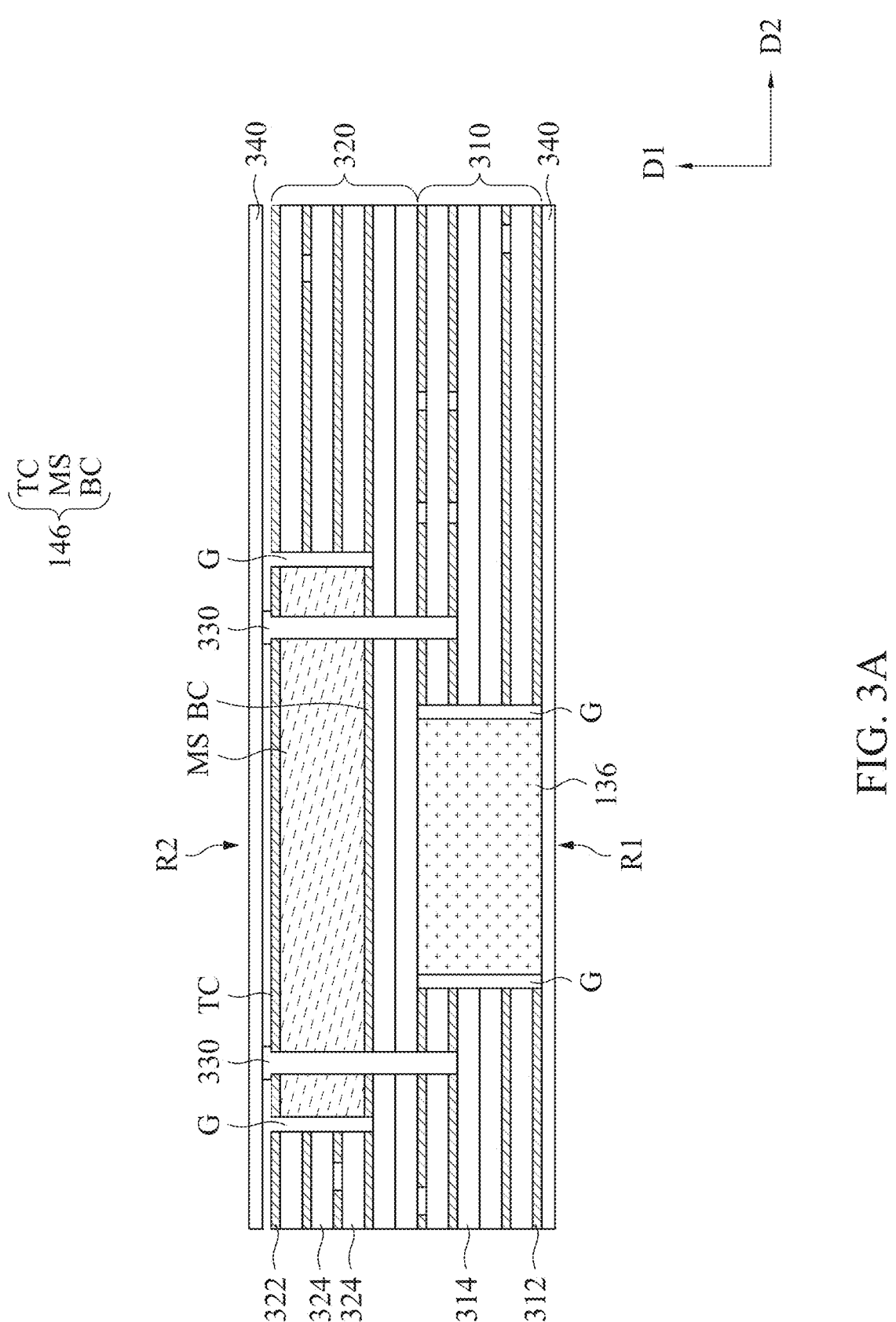
FIGS. 3A, 3B and 3C are schematic cross-sectional views of the circuit board of FIG. 1 at various stages of the manufacturing process.
Figure 3B:
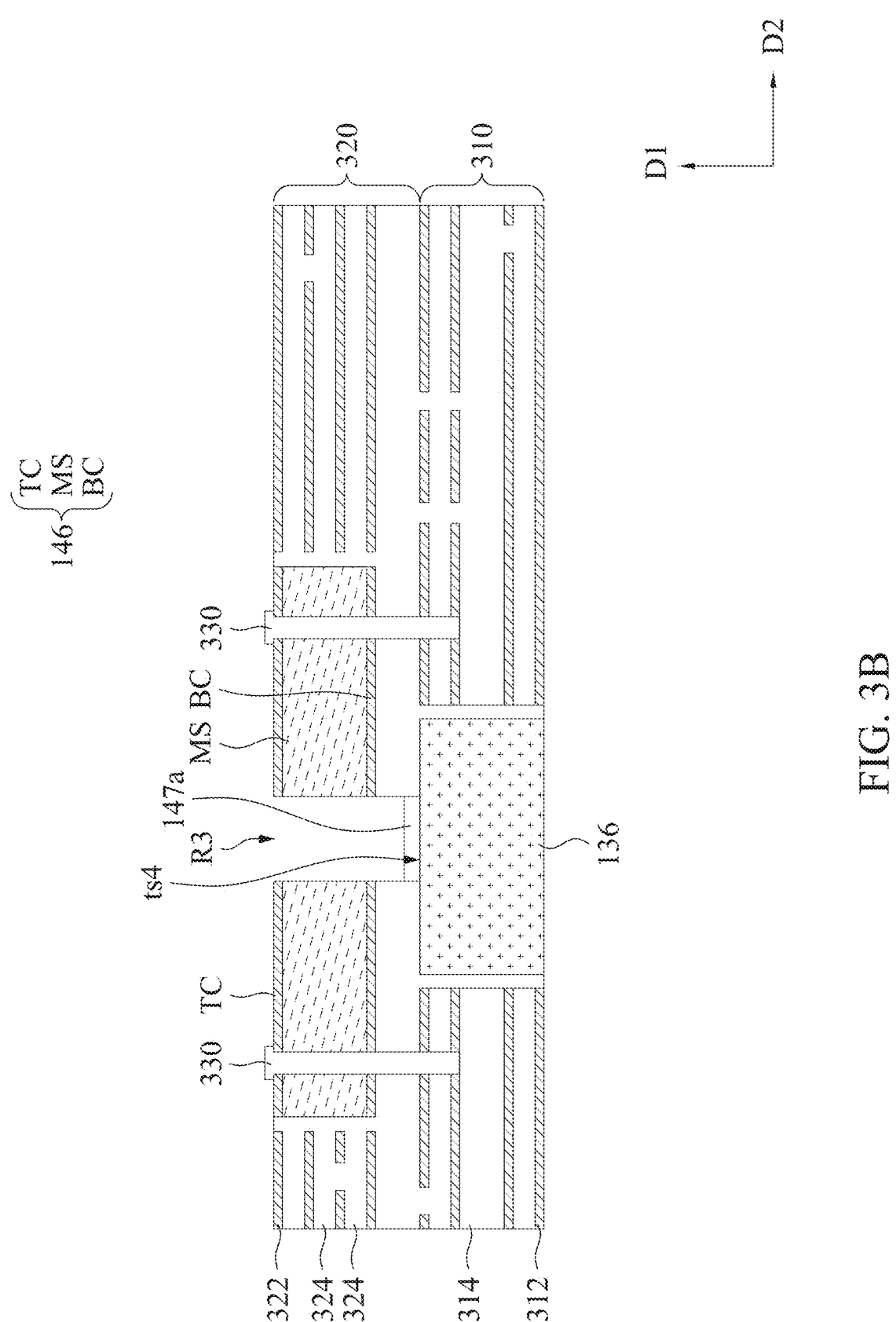
Figure 3C:
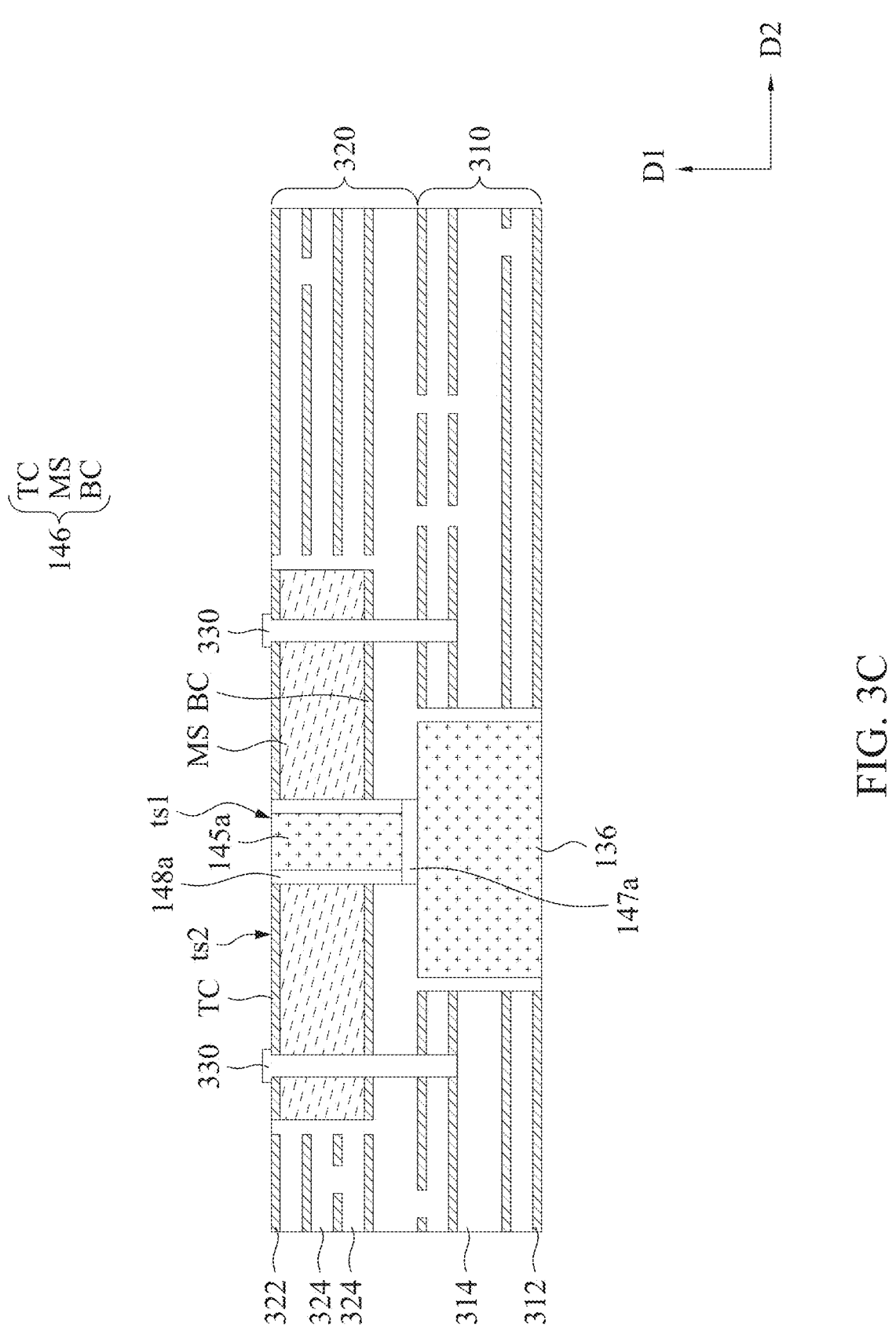

FIGS. 3A, 3B and 3C are schematic cross-sectional views of the circuit board 100 of FIG. 1 at various stages of the manufacturing process. Referring to FIG. 3A, a first wiring substrate 310, a second wiring substrate 320, the first metal block 136, the high-frequency substrate 146 and rivets 330 are provided. The first wiring substrate 310 includes a first external metal layer 312, a plurality of insulating layers 314 and a first groove R1. The first metal block 136 is disposed in the first groove R1, in which the width of the first metal block 136 is less than a width of the first groove R1.

It is worth noting that there is an air gap G between the first metal block 136 and the first wiring substrate 310. The second wiring substrate 320 includes a second external metal layer 322, a plurality of insulating layers 324 and a second groove R2. The high-frequency substrate 146 is disposed in the second groove R2, in which a width of the high-frequency substrate 146 is less than a width of the second groove R2. It is worth noting that there is an air gap G between the high-frequency substrate 146 and the second wiring substrate 320, in which the air gap G may surround the high-frequency substrate 146. The material of each of the plurality of insulating layers 314 and each of the plurality of insulating layers 324 may be, for example, a composite material containing fiberglass and epoxy resin, such as FR4.

It can be understood that the first wiring substrate 310 may include a plurality of internal plates, in which the internal plate may be, for example, a copper clad laminate (CCL). The insulating layer 314 is disposed between the plurality of internal plates. The second wiring substrate 320 may include a plurality of internal plates, in which the internal plate may be, for example, a copper clad laminate. The insulating layer 324 is disposed between the plurality of internal plates. In some embodiments, the first groove R1 may be formed by routing, and the second groove R2 may also be formed by routing.

In some embodiments, the width of the first groove R1 is wider than the width of the first metal block 136 by 0.2 mm to 0.3 mm. In some embodiments, the width of the second groove R2 is wider than the width of the high-frequency substrate 146 by 0.2 mm to 0.4 mm.

After the first wiring substrate 310, the second wiring substrate 320, the first metal block 136, the high-frequency substrate 146 and the rivets 330 are provided, the first wiring substrate 310, the high-frequency substrate 146 and the second wiring substrate 320 are fixed together through the rivets 330. It should be noted that the rivets 330 are used to temporarily combine the substrates (i.e., the first wiring substrate 310, the high-frequency substrate 146 and the second wiring substrate 320) that are otherwise separated from each other, so that they are not separated from each other. Once all the rivets 330 are removed, the first wiring substrate 310, the high-frequency substrate 146 and the second wiring substrate 320 are still separated from each other.

Before fixing the first wiring substrate 310, the high-frequency substrate 146 and the second wiring substrate 320 together through the rivets 330, the first wiring substrate 310 and the second wiring substrate 320 may be drilled to form holes, so as to facilitate subsequently fixing the plurality of substrates together by inserting the rivets 330. In some embodiments, the diameter of the above hole is 1.95 mm to 2.05 mm, for example, 2.0 mm.

After the first metal block 136 is disposed in the first groove R1, the high-frequency substrate 146 is disposed in the second groove R2, and the first wiring substrate 310, the high-frequency substrate 146 and the second wiring substrate 320 are fixed together through the rivets 330, the first wiring substrate 310, the high-frequency substrate 146, the second wiring substrate 320 and the first metal block 136 are pressed together through a pressing step. The above pressing step is performed through release films 340 (as shown in FIG. 3A). In some embodiments, the above pressing step has a pressing temperature of 185° C. to 195° C., for example, 190° C. In some embodiments, the above pressing step has a pressing pressure of 2.5 MPa to 2.7 MPa, for example, 2.55 MPa, 2.6 MPa or 2.65 MPa. In some embodiments, the above pressing step has a pressing time of 140 minutes to 160 minutes, for example, 145 minutes, 150 minutes or 155 minutes.

During the high-temperature and high-pressure pressing step, a portion of the material of the insulating layer 314 flows to the air gap G between the first metal block 136 and the first wiring substrate 310, and a portion of the material of the insulating layer 324 flows to the air gap G between the high-frequency substrate 146 and the second wiring substrate 320. Therefore, after the high-temperature and high-pressure pressing step, the first metal block 136 is embedded in the first wiring substrate 310, and the high-frequency substrate 146 is embedded in the second wiring substrate 320. The first metal block 136 and the high-frequency substrate 146 are both covered by the material of the insulating layer 314 and the insulating layer 324, as shown in FIG. 3B.

Referring to FIG. 3B, a portion of the high-frequency substrate 146 and a portion of the second wiring substrate 320 are removed to form a third groove R3, in which the third groove R3 exposes a portion of a top surface ts4 of the first metal block 136. In some embodiments, the third groove R3 may be formed with a depth to the top surface ts4 of the first metal block 136 by using computer numerical control (CNC) for mechanical processing (for example, routing).

After the third groove R3 is formed, the first conductive material 147a is disposed at a bottom of the third groove R3, as shown in FIG. 3B. Specifically, the first conductive material 147a covers the top surface ts4 of the first metal block 136. In some embodiments, a heat conduction coefficient of the first conductive material 147a is greater than 180 W/m K. In some embodiments, a thickness of the first conductive material 147a is 0.0875 mm to 0.1125 mm, for example, 0.09 mm, 0.1 mm or 0.11 mm. In some embodiments, after the first conductive material 147a is disposed at the bottom of the third groove R3, the first conductive material 147a is heated at 95° C. to 105° C. for 9 minutes to 11 minutes, to remove the solvent of the first conductive material 147a. The heating temperature of the above first conductive material 147a is, for example, 100° C. The heating time of the above first conductive material 147a may be, for example, 9.5 minutes, 10 minutes or 10.5 minutes.

Referring to FIG. 3C, the second metal block 145a is provided, in which the width of the second metal block 145a is less than a width of the third groove R3 (referring to FIG. 3B), and the width of the second metal block 145a is less than the width of the first metal block 136. In some embodiments, the width of the third groove R3 (referring to FIG. 3B) is wider than the width of the second metal block 145a by 0.3 mm to 0.5 mm, for example, 0.35 mm, 0.4 mm or 0.45 mm. The second metal block 145a is disposed in the third groove R3 (referring to FIG. 3B), as shown in FIG. 3C. In some embodiments, the second metal block 145a is first dipped in heat-hydrolyzable glue, and then the second metal block 145a is disposed on the first conductive material 147a. After that, a sintering step is performed. In some embodiments, the sintering step has a sintering temperature of 245° C. to 255° C., a sintering time of 28 minutes to 32 minutes, and a sintering pressure of 9 MPa to 11 MPa. The above sintering temperature may be, for example, 250° C. The above sintering time may be, for example, 29 minutes, 30 minutes or 31 minutes. The above sintering pressure may be, for example, 9.5 MPa, 10 MPa or 10.5 MPa.

After the second metal block 145a is disposed in the third groove R3, the first filling material 148a is disposed around the second metal block 145a, as shown in FIG. 3C. In some embodiments, the first filling material 148a is disposed around the second metal block 145a by screen printing, and then the first filling material 148a is pre-baked at 105° C. to 115° C. for 58 minutes to 62 minutes. The above pre-baking temperature may be, for example, 110° C., and the above pre-baking time may be, for example, 59 minutes, 60 minutes or 61 minutes. After filling with the first filling material 148a, the first filling material 148a is baked until the first filling material 148a is hardened. In the embodiment of FIG. 3C, the top surface ts1 of the second metal block 145a is flush with the top surface ts2 of the top wiring layer TC. In some embodiments, the rivets 330 are removed after the second metal block 145a is disposed in the third groove R3.

Referring to FIG. 3C and FIG. 1, after the second metal block 145a is disposed in the third groove R3, the plurality of plated through-holes 160 are formed in the first wiring substrate 310 and the second wiring substrate 320. The first external wiring layer 110 as shown in FIG. 1 is formed by using the first external metal layer 312. The second external wiring layer 120 as shown in FIG. 1 is formed using the second external metal layer 322. In some embodiments, the first external wiring layer 110 and the second external wiring layer 120 may be formed by a semi-additive process or a subtractive process.

Figure 4A:
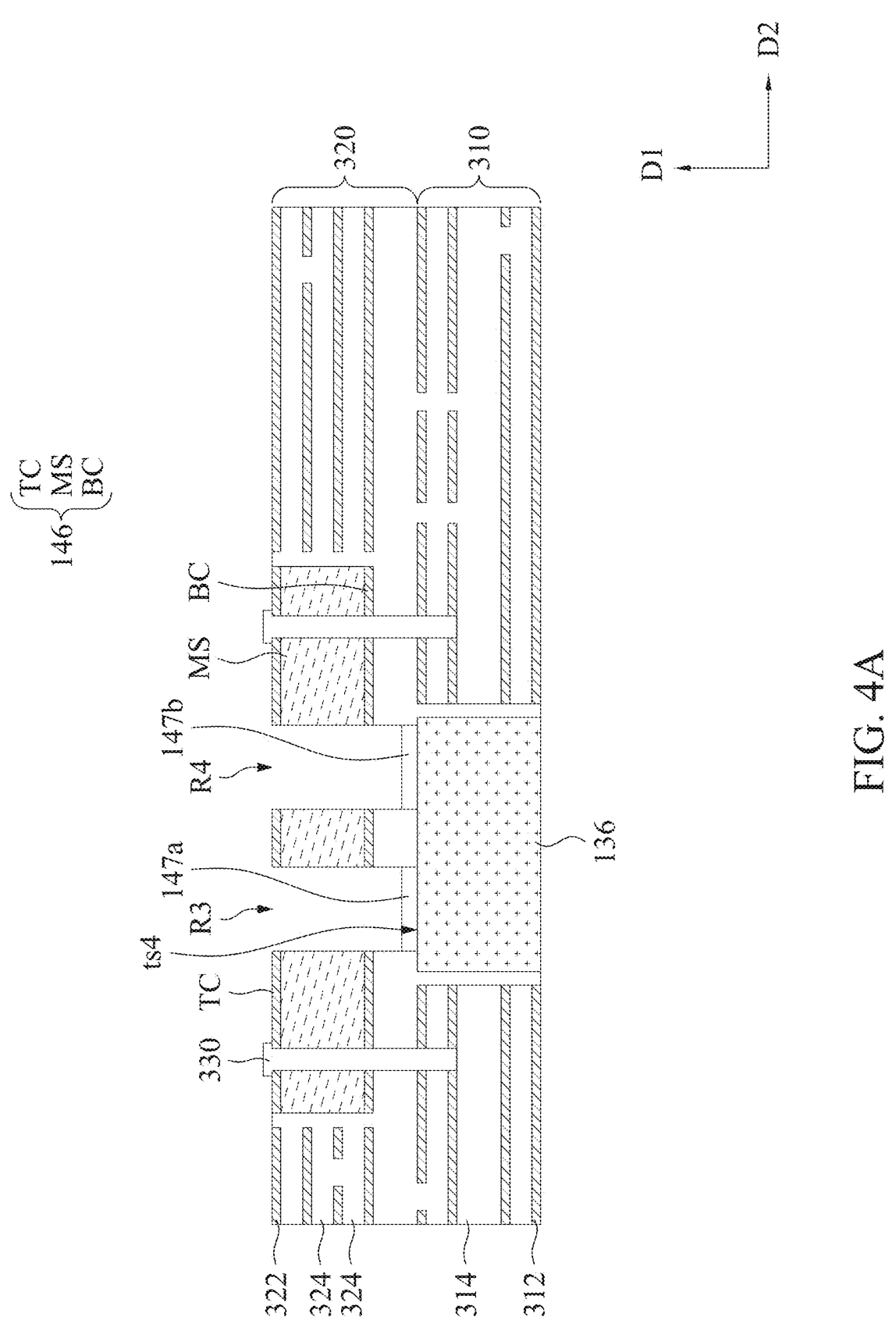
FIGS. 4A and 4B are schematic cross-sectional views of the circuit board of FIG. 2 at various stages of the manufacturing process.
Figure 4B:
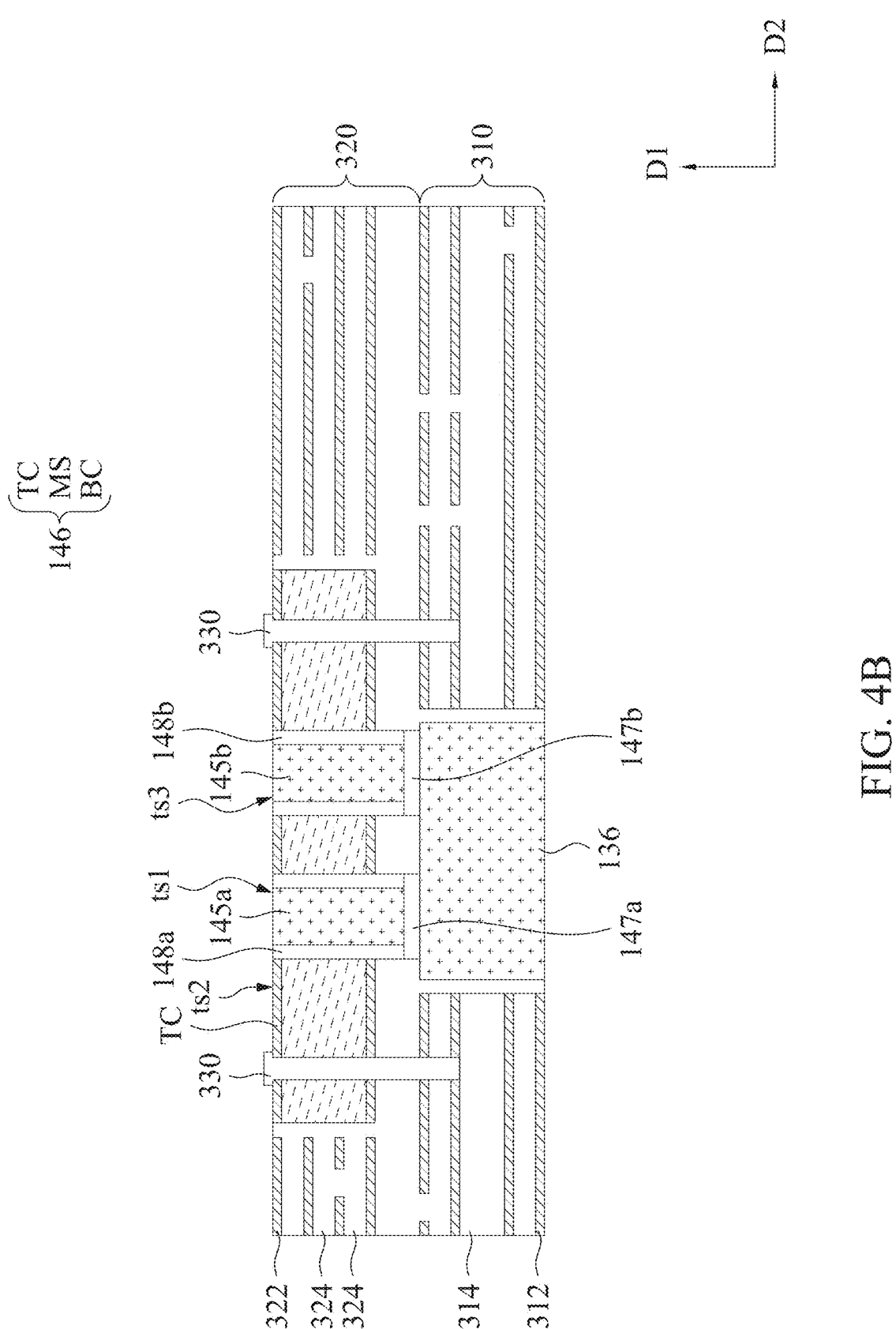

FIGS. 4A and 4B are schematic cross-sectional views of the circuit board 200 of FIG. 2 at various stages of the manufacturing process. The manufacturing method of FIGS. 4A and 4B is similar to the manufacturing method of FIGS. 3B and 3C. Referring to FIG. 4A, after the first wiring substrate 310, the second wiring substrate 320 (which has the third groove R3), the first metal block 136, the high-frequency substrate 146 and the rivets 330 as shown in FIG. 3A are provided, another portion of the high-frequency substrate 146 and another portion of the second wiring substrate 320 are further removed to form a fourth groove R4, in which the fourth groove R4 exposes another portion of the top surface ts4 of the first metal block 136. Then, the second conductive material 147b is disposed at a bottom of the fourth groove R4.

Referring to FIG. 4B, the third metal block 145b is provided, in which the width of the third metal block 145b is less than a width of the fourth groove R4 (referring to FIG. 4A), and the width of the third metal block 145b is less than the width of the first metal block 136. The second metal block 145a is disposed in the third groove R3 (referring to FIG. 4A), and the third metal block 145b is disposed in the fourth groove R4 (referring to FIG. 4A), as shown in FIG. 4B. In some embodiments, the third metal block 145b is first dipped in heat-hydrolyzable glue, and then the third metal block 145b is disposed on the first conductive material 147b. After that, a sintering step is performed. In some embodiments, the sintering step has a sintering temperature of 245° C. to 255° C., a sintering time of 28 minutes to 32 minutes, and a sintering pressure of 9 MPa to 11 MPa. The above sintering temperature may be, for example, 250° C. The above sintering time may be, for example, 29 minutes, 30 minutes or 31 minutes. The above sintering pressure may be, for example, 9.5 MPa, 10 MPa or 10.5 MPa.

After the third metal block 145b is disposed in the fourth groove R4, the second filling material 148b is disposed around the third metal block 145b, as shown in FIG. 4B. In the embodiment of FIG. 4B, the top surface ts3 of the third metal block 145b is flush with the top surface ts2 of the top wiring layer TC.

In summary, the circuit board provided by the present disclosure includes small metal blocks (for example, the second metal block 145a and the third metal block 145b) and large metal blocks (for example, the first metal block 136) stacked on each other, so that the backsides of the electronic components can achieve the heat dissipation effect through the small metal blocks and the large metal block. Since the electronic components (for example, chips), the small metal blocks, and the large metal block are stacked and aligned vertically, and the width of the large metal block is wider than the width of the small metal blocks, the circuit board has the fan-shaped heat dissipation paths, thereby improving the heat dissipation effect on the electronic components. In addition, one large metal block may be connected to a plurality of small metal blocks and a plurality of electronic components, so that the plurality of electronic components distributed at a high density in the circuit board still have good heat dissipation paths.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board, comprising:
a first external wiring layer;
a second external wiring layer;
a first internal structure; and
a second internal structure, wherein the first internal structure and the second internal structure are disposed between the first external wiring layer and the second external wiring layer, the first internal structure is disposed between the first external wiring layer and the second internal structure, and the second internal structure is disposed between the first internal structure and the second external wiring layer;
wherein the first internal structure comprises:
a first metal block, wherein the first metal block extends from the first external wiring layer to the second internal structure;
wherein the second internal structure comprises:
a second metal block;
a high-frequency substrate, wherein the second metal block penetrates through the high-frequency substrate, wherein the high-frequency substrate comprises:
a top wiring layer;
a bottom wiring layer; and
a substrate body disposed between the top wiring layer and the bottom wiring layer; and
a first conductive material disposed on the first metal block, wherein the second metal block extends from the second external wiring layer to the first conductive material, and the first conductive material electrically connects the first metal block and the second metal block.

2. The circuit board of claim 1, wherein a bottom of the second metal block protrudes from a bottom surface of the bottom wiring layer of the high-frequency substrate.

3. The circuit board of claim 1, wherein a thickness of the high-frequency substrate is less than a thickness of the second metal block.

4. The circuit board of claim 1, wherein the second internal structure further comprises a filling material, the filling material is disposed between the second metal block and the substrate body, and the filling material contacts the first conductive material.

5. The circuit board of claim 1, further comprising:
an electronic component located directly above the second metal block and electrically connected to the second external wiring layer; and
a plated through-hole, wherein the plated through-hole passes through the high-frequency substrate.

6. The circuit board of claim 1, wherein a width of the first metal block is wider than a width of the second metal block.

7. The circuit board of claim 1, wherein a top surface of the second metal block is flush with a top surface of the top wiring layer.

8. The circuit board of claim 1, wherein the second internal structure further comprises:
a third metal block; and
a second conductive material disposed on the first metal block, wherein the third metal block extends from the second external wiring layer to the second conductive material, and the second conductive material electrically connects the first metal block and the third metal block.

9. The circuit board of claim 8, wherein a top surface of the third metal block is flush with a top surface of the top wiring layer.

10. The circuit board of claim 8, wherein a bottom of the third metal block protrudes from a bottom surface of the bottom wiring layer of the high-frequency substrate.

11. A manufacturing method of a circuit board, comprising:
providing a first wiring substrate, wherein the first wiring substrate comprises a first external metal layer and a first groove;
providing a first metal block, wherein a width of the first metal block is less than a width of the first groove;
disposing the first metal block in the first groove;
providing a second wiring substrate, wherein the second wiring substrate comprises a second external metal layer and a second groove;
providing a high-frequency substrate, wherein a width of the high-frequency substrate is less than a width of the second groove;
disposing the high-frequency substrate in the second groove;
fixing the first wiring substrate, the high-frequency substrate and the second wiring substrate together through a rivet;
removing a portion of the high-frequency substrate and a portion of the second wiring substrate to form a third groove, wherein the third groove exposes a portion of a top surface of the first metal block;
disposing a first conductive material at a bottom of the third groove;
providing a second metal block, wherein a width of the second metal block is less than a width of the third groove, and the width of the second metal block is less than the width of the first metal block;
disposing the second metal block in the third groove;
disposing a first filling material around the second metal block;
after disposing the second metal block in the third groove, forming a plurality of plated through-holes in the first wiring substrate and the second wiring substrate;
forming a first external wiring layer by using the first external metal layer; and
forming a second external wiring layer by using the second external metal layer.

12. The manufacturing method of a circuit board of claim 11, further comprising:
removing the rivet after disposing the second metal block in the third groove.

13. The manufacturing method of a circuit board of claim 11, further comprising:
removing another portion of the high-frequency substrate and another portion of the second wiring substrate to form a fourth groove, wherein the fourth groove exposes another portion of a top surface of the first metal block;
disposing a second conductive material at a bottom of the fourth groove;
providing a third metal block, a width of the third metal block is less than a width of the fourth groove, wherein the width of the third metal block is less than the width of the first metal block;
disposing the third metal block in the fourth groove; and disposing a second filling material around the third metal block.

14. The manufacturing method of a circuit board of claim 11, wherein after fixing the first wiring substrate, the high-frequency substrate and the second wiring substrate together through the rivet, performing a pressing step to press the first wiring substrate, the high-frequency substrate, the second wiring substrate and the first metal block through release films.

15. The manufacturing method of a circuit board of claim 11, wherein the first filling material is disposed around the second metal block by screen printing, and then the first filling material is pre-baked at 105° C. to 115° C. for 58 minutes to 62 minutes.

* * * * *